United States Patent
Weir et al.

[11] Patent Number: 5,960,331
[45] Date of Patent: Sep. 28, 1999

[54] DEVICE AND METHOD FOR MAINTAINING SYNCHRONIZATION AND FREQUENCY STABILITY IN A WIRELESS TELECOMMUNICATION SYSTEM

[75] Inventors: Steve Weir, Petaluma; Vincent Korsky, San Rafael; Harbans Sehmar, Potaluma; Ronald Foerster; Warren Payne, both of Petaluma; Charles Petersen, Fairfax, all of Calif.

[73] Assignee: Harris Corporation, Melbourne, Fla.

[21] Appl. No.: 08/673,031

[22] Filed: Jul. 1, 1996

[51] Int. Cl.⁶ .................................................. H04B 1/40
[52] U.S. Cl. ............................ 455/75; 455/205; 455/554; 455/555
[58] Field of Search ........................ 455/265, 554, 455/555, 119, 75, 208

[56] References Cited

U.S. PATENT DOCUMENTS

| | | |
|---|---|---|
| 4,423,493 | 12/1983 | Annecke . |
| 4,538,110 | 8/1985 | Hollaar et al. . |
| 4,625,331 | 11/1986 | Richardson et al. ................ 455/265 |
| 4,707,142 | 11/1987 | Baker et al. . |
| 4,928,275 | 5/1990 | Moore et al. . |
| 4,939,790 | 7/1990 | Sgrignoli ............................... 455/265 |
| 5,090,051 | 2/1992 | Muppidi et al. ...................... 455/555 |
| 5,115,515 | 5/1992 | Yamamoto et al. .................. 455/265 |
| 5,133,001 | 7/1992 | Bohm .................................... 455/555 |
| 5,170,492 | 12/1992 | Moller et al. ......................... 455/265 |
| 5,206,857 | 4/1993 | Farleigh . |
| 5,331,667 | 7/1994 | Izumi . |
| 5,515,426 | 5/1996 | Yacenda et al. ...................... 455/555 |
| 5,630,215 | 5/1997 | Waldie et al. ........................ 455/265 |
| 5,687,194 | 11/1997 | Paneth et al. ......................... 455/554 |

Primary Examiner—David R. Hudspeth
Assistant Examiner—Daniel Abebe
Attorney, Agent, or Firm—Rogers & Killeen

[57] ABSTRACT

Techniques employed to guarantee isochronous operation of a wireless system to within Federal Communication Commission, Unlicensed Personal Communication System (UPCS) requirements. Synchronization and frequency stability is tracked and maintained for more than one frequency references of stratum 3 or better in a wireless telecommunication system.

10 Claims, 2 Drawing Sheets

DEVICE AND METHOD FOR MAINTAINING SYNCHRONIZATION AND FREQUENCY STABILITY IN A WIRELESS TELECOMMUNICATION SYSTEM

BACKGROUND OF THE INVENTION

The present invention relates to wireless telecommunication systems, and more particularly to a system and method for maintaining synchronization and frequency stability in a wireless communication device of a telecommunication system PBX where the clock for the PBX does not consistently provide an input to the wireless device which has adequate frequency stability.

With reference to FIG. 1, telecommunication systems may include a private exchange (PBX) 8 for providing telephone service to a local network of telephones, such as in an office. PBX 8 may be connected to its network of telephones 12 through cables, and more recently to telephones 14 through wireless connections. The expansion of the traditional PBX into wireless communication has, however, brought out the need for improvements to portions of the PBX 8. One area for improvement is in the wireless device (WPBX) 16 of PBX 8 which provides the wireless connections and operates with frequencies which must be more stable than was needed for cable communication. That is, the stability of a system clock input CLK 34 from a system clock in PBX 8 is satisfactory for cable communication, but not for wireless communication.

The source of wireless device clock input CLK 34 is generally phase locked to PBX 8 which is synchronized to a network clock 22 (via a digital connection, T1/E1) or alternately wireless device is synchronized to the PBX 8 that is operating with a standalone reference clock.

By way of example, a wireless PBX communication may require a frequency stability of better than plus or minus 4.6 parts per million. However, wireless device clock input CLK 34 may meet this frequency stability requirement part of the time. During other periods of time the frequency of wireless device clock input CLK 34 is not stable enough for use in wireless device 16. With reference to FIG. 2, one solution would be to upgrade the source of network clock input 22 to meet the frequency stability requirement of wireless device 16. This is not always practical in all PBX System configurations and installations. Some configurations may not have digital connections to the network and therefore will operate as a stand alone system. A second solution would be to provide a PBX PLL, 36 that meets or exceeds the wireless device clock requirements. This is not only a costly implementation but also not desirable because this PLL normally is required to track a network clock of lower precision.

Accordingly, it is an object of the present invention to provide a novel system and method for providing a wireless device in a telecommunication system with a stable frequency and synchronization which obviates the problems of the prior art.

It is another object of the present invention to provide a novel system and method for maintaining frequency stability in a wireless device of a telecommunication system which uses a system clock CLK 34 for normal operation thereof and in which the wireless device is operated with reference to a precision oscillator, 28 that has a frequency stability which meets or exceeds the frequency stability requirement of the wireless device.

It is yet another object of the present invention to provide a novel system and method for maintaining frequency stability in a wireless device of a telecommunication system where the PBX PLL 32 maintains the frequency synchronization to a network clock input 22, and in which the frequency stability of the system clock 32 with reference to the precision oscillator is frequency evaluated 30 to insure stability within the limits required by the wireless device 16.

It is still another object of the present invention to provide a novel system and method for maintaining frequency stability in a wireless device of a telecommunication system in which the frequency stability of the system clock 32 is longer within the limits of the wireless clock 34. The stability evaluator 30 in conjunction with the precision oscillator 28 maintains the frequency stability requirement of the wireless device 16. The frequency synchronization is not maintained to the system clock 32 during this time. It is a further object of the present invention to provide a novel system and method for maintaining frequency stability in a wireless device of a telecommunication system in which the difference in clock synchronization between the PBX PLL clock 32 and the wireless device clock 34 are buffered in an elastic store to minimize frame slips between the wireless system and the PBX.

It is still a further object of the present invention to provide a novel system and method for maintaining frequency stability in a wireless device of a telecommunication system in which the stability synchronizer 33 in conjunction with the stability evaluator 30 are used to adjust the frequency of the wireless clock 34 to increase or decrease the period during which the frequency stability of the wireless clock 34 continues to meet the frequency stability requirement of the wireless device.

It is yet a further object of the present invention to provide a novel system and method for maintaining frequency stability in a wireless device of a telecommunication system which the frequency stability evaluator 30 tracks the PBX PLL 32 or network clock 22 while the frequency stability is within the limits of the wireless device requirements. The frequency stability evaluator maintains the frequency stability of the wireless device clock 34 at the limit as long as the PBX PLL 32 or network clock 22 are outside the requirement of the wireless device and will track the PBX PLL or network clock when these clocks are again within the stability requirements on the wireless device.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
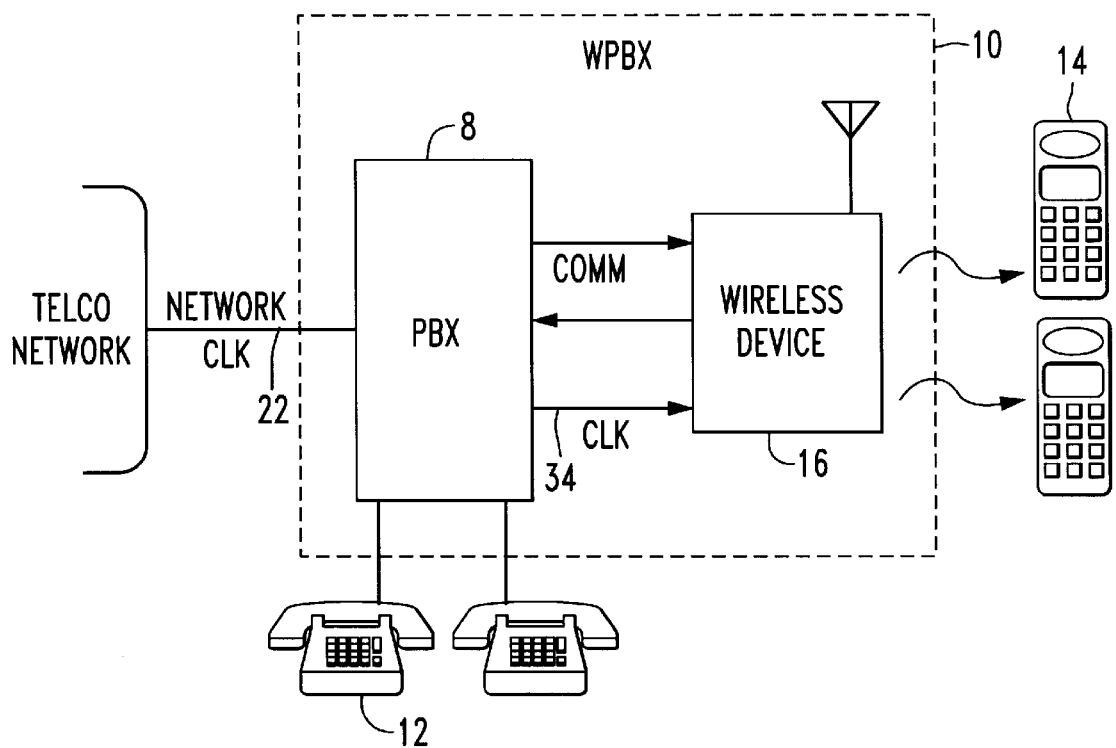
FIG. 1 is a block diagram of a telecommunications system with a wireless PBX components.
Figure 2:
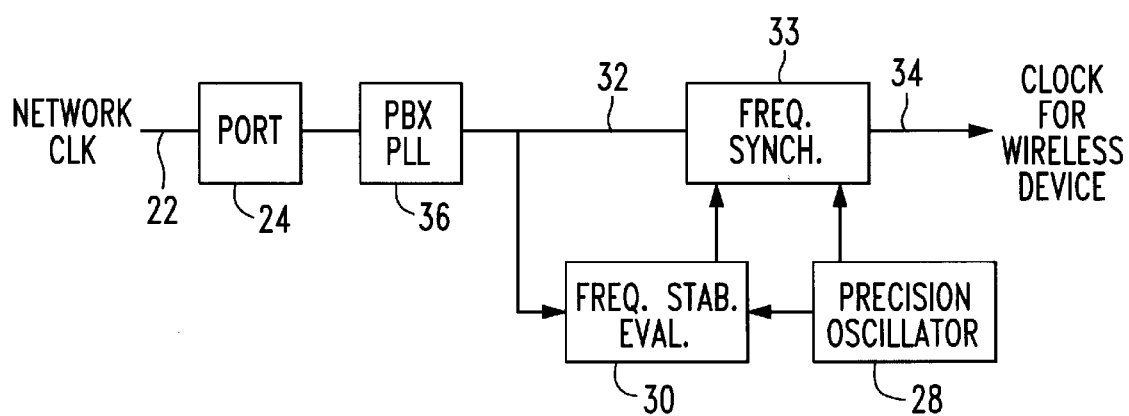
FIG. 2 is a partial block diagram of an embodiment of a wireless communication device of the present invention.

With reference now to FIG. 2, an embodiment of the present invention may include a wireless communication device 16 (FIG. 1) which requires a clock input with a frequency more stable than that of a network clock input 22. Network clock input 22 may be received at input port 24 and provided to frequency synchronizer 33. Network clock input 22 may have a frequency stable enough for wireless communication device 16 only part of the time. A precision oscillator 28 provides reference for wireless communication device 16 and has a frequency stability which meets the frequency stability requirement of wireless communication device 16.

The frequency stability of the PBX PLL 36 is evaluated in stability evaluator 30 by referencing the precision oscillator 28, as will be discussed in more detail below. As a result of that evaluation, the frequency stability of the precision clock 28 to PBX PLL clock 32 is maintained so long as the frequency stability of network clock input 22 meets the frequency stability requirement of wireless communication device 16. The frequency stability and synchronization is not maintained so long as the frequency stability of network clock input 22 does not meet the frequency stability requirement of wireless communication device 16.

The precision oscillator 28 may be any conventional clocking device such as a temperature compensated crystal oscillator (TCXO) which meets the frequency stability requirements of wireless communication device 16. For example, wireless communication at 2.048 MHz may require a frequency stability of better than ±4.6 ppm, and a precision oscillator providing a frequency stability of better than plus or minus one part per million.

Figure 3:
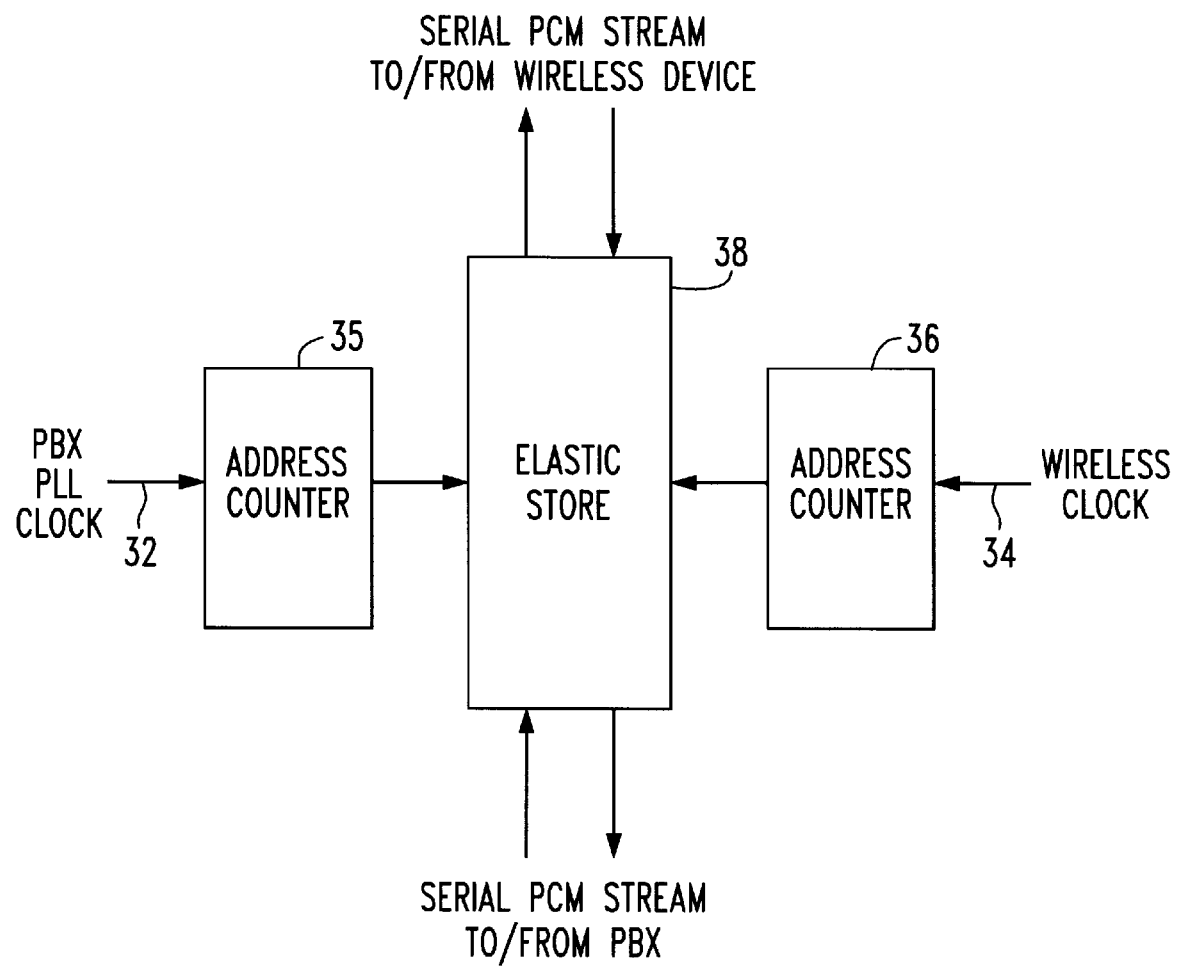
FIG. 3 is a partial block diagram of an embodiment of a wireless communication device of the present invention.

With reference to FIG. 3, PCM is serially shifted in and out of the elastic store 38 by the PBX clock 32 on one side and by the wireless clock 34 on the other side. The PBX clock and the wireless clock are not necessarily always phase or frequency synchronous the elastic store buffer allows for this phase and frequency wander. The function of the elastic store 38 is to provide a means of transporting the PCM information from the PBX side to the wireless side and visa versa where the PBX clock and the wireless clock are not phase and frequency synchronous and allow for controlled frame slips when necessary thus maximizing audio quality.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method for maintaining frequency stability in a wireless device of a telecommunication system which uses a network clock for normal operation thereof and in which the wireless communication device requires a clock input with a frequency more stable than that of a PEX system clock, the method comprising the steps of:
   (a) providing an input to the wireless communication device from the PBX system clock;
   (b) operating the wireless communication device with reference to a precision oscillator which has a frequency stability which meets or exceeds the frequency stability requirement of the wireless communication device;
   (c) frequency synchronizing PBX system clock to network clock; and
   (d) evaluating the frequency stability of the PBX system clock input with reference to the precision oscillator, and based on the evaluation,
      (1) maintaining frequency stability of the wireless clock to the PBX system clock input while the frequency stability of the PBX system clock input meets the frequency stability requirement of the wireless communication device, and
      (2) not maintaining frequency stability of the wireless clock to the PBX system clock input while the frequency stability of the PBX system clock input does not meet the frequency stability requirement of the wireless communication device.

2. The method of claim 1 wherein the telecommunication system has two clock sources, first is a PBX PLL for controlling the frequency of the PBX system clock to the network clock and wherein the second is the wireless clock that has a frequency stability evaluator, frequency synchronizer and precision oscillator for controlling the frequency thereof, and wherein the step of evaluating the frequency stability of the PBX system clock input with reference to the network clock and a further step of using the PBX system clock with reference to the precision oscillator to derive the wireless clock stability.

3. The method of claim 2 further comprising the step of periodically using the stability evaluator to direct the frequency synchronizer to adjust the frequency of the wireless clock communication device by increasing or decreasing the period of a cycle of the wireless clock, while maintaining the frequency stability of the wireless communication device, relative to the PBX system clock thus minimizing frame slips between the PBX system and the wireless device.

4. The method of claim 3 further comprising the step of providing a controlled slip of a frame of telecommunication data before a condition arises wherein an elastic store PBX side counters and the wireless side counters address the same memory space.

5. The method of claim 1 wherein the frequency stability requirement of the wireless communication device is better than plus or minus 4.6 parts per million and wherein the step of operating the wireless communication device with reference to a precision oscillator comprises the step of providing a temperature compensated crystal oscillator which has a frequency stability of better than plus or minus one part per million.

6. A wireless communication device of a telecommunication system which uses a PBX system clock for normal operation thereof, the wireless communication device requiring a clock input with a frequency more stable than that of the PBX system clock, the wireless communication device comprising:
   (a) means for receiving a wireless clock input from the system clock;
   (b) a wireless clock operating the wireless communication device which has a frequency stability which meets the frequency stability requirement of the wireless communication device;
   (c) means for frequency synchronizing said wireless clock to the PBX system clock input; and
   (d) means for evaluating the frequency stability of the PBX system clock input with reference to a precision oscillator, wherein the frequency synchronization of said wireless clock to the PBX system clock input is maintained while the frequency stability of the PBX system clock input meets the frequency stability requirement of the wireless communication device, and frequency synchronization of said wireless clock to the PBX system clock input is not maintained while the frequency stability of the PBX system clock input does not meet the frequency stability requirement of the wireless communication device.

7. The wireless communication device of claim 6 wherein the telecommunication system has a PBX PLL for synchronizing the frequency of the PBX system clock to a network clock and wherein generation of a wireless clock comprised of a precision oscillator, stability evaluator and frequency synchronizer for controlling the frequency thereof, and wherein said means for evaluating the frequency stability of the PBX system clock input with reference to said precision oscillator comprises means for guaranteeing stability requirements of the wireless device.

8. The wireless communication device of claim 7 further comprising an elastic store and a pair of address counters whose function is to provide a means of transporting the PCM information from the PBX side to the wireless side and visa versa where the PBX clock and the wireless clock are not necessarily phase and frequency synchronous and allow for controlled frame slips when necessary.

9. The method of claim 2 wherein the frequency stability of the wireless communication device is determined in which the frequency stability evaluator tracks the PBX PLL or network clock while the frequency stability is within the limits of the wireless communication device requirements.

10. The method of claim 9 further comprises the ability of the frequency stability evaluator to maintain the frequency stability of the wireless communication device clock at the limit as long as the PBX PLL or network clock are outside the requirement of the wireless communication device and will track the PBX PLL or network clock from that limit when these clocks are again within the stability requirements on the wireless communication device.

* * * * *